United States Patent
Huang et al.

(10) Patent No.: US 6,819,108 B2
(45) Date of Patent: Nov. 16, 2004

(54) METHOD OF MAGNETIC FIELD CONTROLLED SHIMMING

(75) Inventors: Jinhua Huang, Florence, SC (US); Bu-Xin Xu, Florence, SC (US); Bijan Dorri, Clifton Park, NY (US); Bruce Amm, Clifton Park, NY (US)

(73) Assignee: General Electric Company, Milwaukee, WI (US)

( * ) Notice: Subject to any disclaimer, the term of this patent is extended or adjusted under 35 U.S.C. 154(b) by 87 days.

(21) Appl. No.: 10/410,416

(22) Filed: Apr. 9, 2003

(65) Prior Publication Data

US 2004/0183536 A1 Sep. 23, 2004

Related U.S. Application Data

(60) Provisional application No. 60/320,037, filed on Mar. 21, 2003.

(51) Int. Cl.[7] .................................................. G01V 3/00
(52) U.S. Cl. ........................................ 324/320; 324/319
(58) Field of Search ................................ 324/320, 319, 324/318, 322, 306, 307, 309, 300

(56) References Cited

U.S. PATENT DOCUMENTS

| | | | |
|---|---|---|---|
| 3,622,869 A | | 11/1971 | Golay |
| 4,672,346 A | | 6/1987 | Miyamoto et al. |
| 4,698,611 A | | 10/1987 | Vermilyea |
| 4,899,109 A | * | 2/1990 | Tropp et al. .............. 324/320 |
| 5,045,794 A | | 9/1991 | Dorri et al. |
| 5,218,299 A | | 6/1993 | Dunkel |
| 5,572,125 A | | 11/1996 | Dunkel |
| 5,760,585 A | | 6/1998 | Dorri |
| 6,181,137 B1 | | 1/2001 | Havens et al. |
| 6,634,088 B1 | * | 10/2003 | Morrone ..................... 29/607 |

OTHER PUBLICATIONS

Morgan PN, Conolly SM, and Macovski A. Resistive homogeneous MRI magnet design by matrix buset selection. Magnetic Resonance in Medicine; 41:1221–1229 (1999).

(List continued on next page.)

*Primary Examiner*—Louis Arana
(74) *Attorney, Agent, or Firm*—Ziolkowski Patent Solutions Group, LLC; Michael A. Della Penna; Carl B. Horton

(57) ABSTRACT

The present invention is directed to a method of shimming a magnet assembly of an MR imaging system such that a desired B0 field strength may be created with minimal inhomogeneities therethrough. With this method, sufficient shimming of the magnet assembly may be achieved without requiring mechanical variations to the magnet assembly after the magnet assembly has been assembled. The invention analyzes variations from the desired B0 field and inhomogeneities at a number of target points along the magnet assembly or B0 field. A comparison is then made at each point to determine a shimming or weighting factor such that the desired overall B0 field strength and targeted field homogeneity is achieved. Active and/or passive shim elements may then be incorporated into the magnet assembly at each target point to achieve the desired overall field strength and minimum overall field homogeneity.

21 Claims, 4 Drawing Sheets

OTHER PUBLICATIONS

Frollo I, Andris P, and Strolka I. Measureing and optimisation methods for basic parameters design in physical experiments. Original publication unknown.

Frollo I, Andris P, and Strolka I. Measuring and magnetic field homogenieity optimisation for magnetics used in NMR–imaging; Measurement Science Review. vol. 1, No. 1, 9–12 (2001).

Principles of magnetic resonance imaging. Chapt. 2. http://fmrib.ox.ac.uk/~stuart/thesis/chapter_2/section2_6.html. Original publication unkown.

Dunkel, Reinhard. The need for magnetic shimming. http://www.sciencesoft.net/Shimlt_Manual/HTML/shimming.html. (Jul. 16, 2000).

Shimlt User Manual Introduction. http://sciencesoft.net/Shimlt Manual/HTML/intro.html. (Original publication date unknown).

How Shimlt Works. http://sciencesoft.net/Shimlt_Manual/HTML/Shimlt.html. (Original publication date unknown).

Matila. Sampo. Measurement and minimization of field inhomogeneities in high resolution NMR. (2001).

* cited by examiner

METHOD OF MAGNETIC FIELD CONTROLLED SHIMMING

CROSS-REFERENCE TO RELATED APPLICATION

The present application claims the benefit of U.S. Ser. No. 60/320,037 filed Mar. 21, 2003.

BACKGROUND OF THE INVENTION

The present invention relates generally to a method of B0 controlled shimming of a magnet assembly of an MR system and, more particularly, to a method of shimming the magnet assembly of an MR system to achieve a near-homogeneous magnetic field having requisite signal strength without requiring mechanical adjustments to the magnet assembly once assembled.

It is generally known that when a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", Mz, may be rotated, or "tipped", into the x-y plane to produce a net transverse magnetic moment $M_t$. A signal is emitted by the excited spins after the excitation signal B1 is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

During fabrication and construction of the magnet assembly for an MR assembly, manufacturing tolerances and deviations in material make-up of the magnet assembly result in an inhomogeneous B0 field being created by the magnet assembly absent shimming. As a result of the magnet manufacturing process, it is not uncommon for the magnet to produce a very inhomogeneous field ranging from several hundred parts per million (ppm) to several thousand ppm, and a non-accurate center magnetic field that is significantly out of range. The importance of these variations is glaringly apparent given that MR systems require an intense uniform magnetic field, typically less than 10 ppm of variations within a 40–50 cm spherical volume, but also an accurate center magnetic field value, typically less than 0.5% variation.

Shimming is a common process that is used to remove inhomogeneities from the B0 field. Shimming is important for MR systems because the average B0 field strength must be within a certain window for the RF hardware of the system. A simplistic example of the effects of shimming is graphically shown in FIG. 1. As shown, a magnet assembly without shimming produces a magnet field represented by curve 2. The variations of the magnetic field are quite clear. As is widely known, these variations negatively affect data acquisition and reconstruction of an MR image. As such, it is desirable to generate a shim field, represented by curve 4, that counters or offsets the variations in the magnetic field. The combination of the shim field 4 with the magnetic field 2 yields, ideally, a homogeneous and uniform B0 field represented by curve 6.

The shimming process includes the precise placement of shim elements within the magnetic assembly such that numerous small magnetic fields are generated to offset variations in the B0 field. The shim elements include active shims such as shim coils or permanent magnets as well as passive shims such as iron cores. Shim coils are common in superconducting magnet assemblies and their shimming may be controlled by regulating current thereto. The shimming characteristics of permanent magnets may be controlled by regulating the mass and polarity of the magnet and the shimming effect of iron cores may be controlled by regulating the mass of the iron incorporated into the magnet assembly.

Regardless of the type of shim element employed, the customary manufacturing and shimming process measures the B0 field of the magnet assembly and then shims the magnet assembly with precise placement of shim elements. The placement of shim elements, however, is done without regard to the affects the shims have on the average field strength of the center B0 field. That is, shimming is concerned with homogeneities in the field and mechanical adjustments to the magnet assembly are later done independently of to address issues regarding average field strength. For example, in a permanent magnet MRI system, mechanical adjustments may include changing the air gap between yokes of the magnet assembly. However, these mechanical adjustments may deviate sufficiently from the magnet design such that performance characteristics such as fringe field are adversely affected. Moreover, mechanical variations or adjustments to the magnet assembly are a time-consuming and costly process that often requires several iterations before sufficient shimming has occurred. In fact, it is not uncommon for the shimming process to take several days to complete. Other approaches include implementation of a mechanical device within the magnet assembly to increase or decrease the B0 field. This device is generally referred to as a "B0 plug" and it increases the overall weight, size, and cost of the magnet assembly.

It would therefore be desirable to have a system and method capable of prescribing shimming of an MR magnet assembly such that time consuming and costly mechanical variations to the magnet assembly are avoided. It would also be desirable to design a model wherein peak-to-peak homogeneity and central field issues are addressed simultaneously.

BRIEF DESCRIPTION OF THE INVENTION

The present invention overcomes the aforementioned drawbacks by providing a method of shimming a magnet assembly of an MR imaging system such that a desired B0 field strength may be created with minimal inhomogeneities therethrough. With this method, sufficient shimming of the magnet assembly may be achieved without requiring mechanical variations to the magnet assembly after the magnet assembly has been assembled. The method, which may be carried out as a set of instructions of a computer program by one or more computers, analyzes variations from the desired B0 field and inhomogeneities at a number of target points along the magnet assembly or B0 field. A comparison is then made at each point to determine a shimming or weighting factor such that the desired B0 field strength and targeted field homogeneity are achieved during data acquisition. Active and/or passive shim elements may then be incorporated into the magnet assembly at each target point to achieve the desired overall field strength and minimum overall field homogeneity. The shimming or weighting factors are used to determine the amount of "shimming material" that is used at each target point.

"Shimming material" varies according to the type of shim element. For example, for active shim elements, i.e. shim coils, the shimming material corresponds to the amount of current applied to the coils. By varying the amount of current applied to the coils, the amount contributed to the magnetic field can be varied. As a result, the shim coils can be independently controlled such that field contribution is precisely controlled. For passive shim elements, i.e. iron shims or permanent magnets, the shimming material corresponds to the amount of magnetic element that is added to the magnet assembly.

Therefore, in accordance with one aspect of the present invention, a method of shimming a magnet for an MR imaging system includes the steps of determining a desired B0 field strength for a B0 field having a number of target points and determining a minimum acceptable field inhomogeneity for the B0 field. The method also includes the step of determining at least one of a field strength variation from the desired B0 field strength and an inhomogeneity variation from the minimum acceptable field inhomogeneity at each target point. Each target point of the B0 field is then shimmed such that at least one of an actual B0 field strength at least approximates the desired B0 field strength and an actual field inhomogeneity does not exceed the minimum acceptable field inhomogeneity.

In accordance with another aspect of the present invention, a computer readable storage medium having a computer program stored thereon to develop a shimming model for a magnet assembly of an MR imaging system, the computer program representing a set of instructions that when executed by a computer causes the computer to map a B0 field generated by an assembled magnet assembly. From the map, a number of target points within the B0 field or, alternately, a set of harmonics are identified. The set of instructions then causes the computer to determine an amount of shimming required at each of the target points such that a desired field strength of the B0 field is maintained simultaneously with substantial cancellation of inhomogeneities within the B0 field.

According to another aspect of the invention, a method of manufacturing a magnet assembly for an MR imaging system is provided. The method includes the step of constructing a permanent magnet assembly designed to generate a B0 field at a desired field strength about a volume-of-interest (VOI). Variations in field strength along the B0 field are then determined. Variations in the field strength are then minimized without requiring mechanical adjustments to the permanent magnet assembly.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
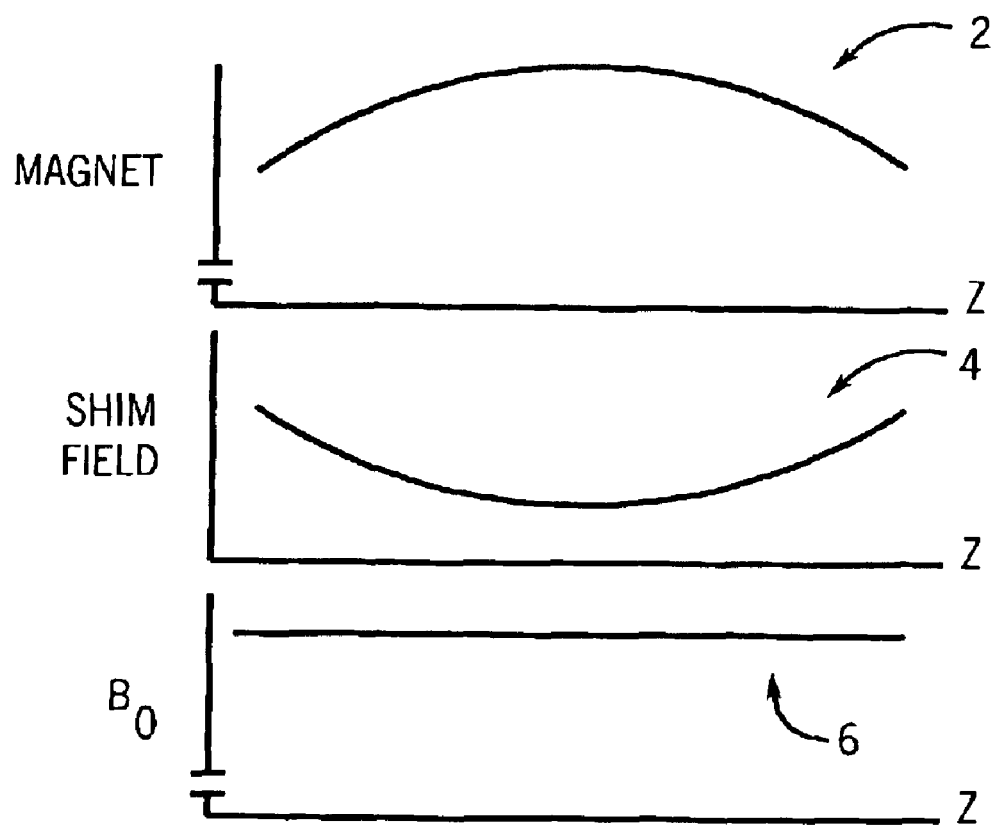
FIG. 1 is a series of curves illustrating a magnetic field generated by a magnet assembly, a shim field generated by shim elements incorporated into a magnet assembly, and a uniform B0 field that is desired when the magnetic field is combined with the shim field.
Figure 2:
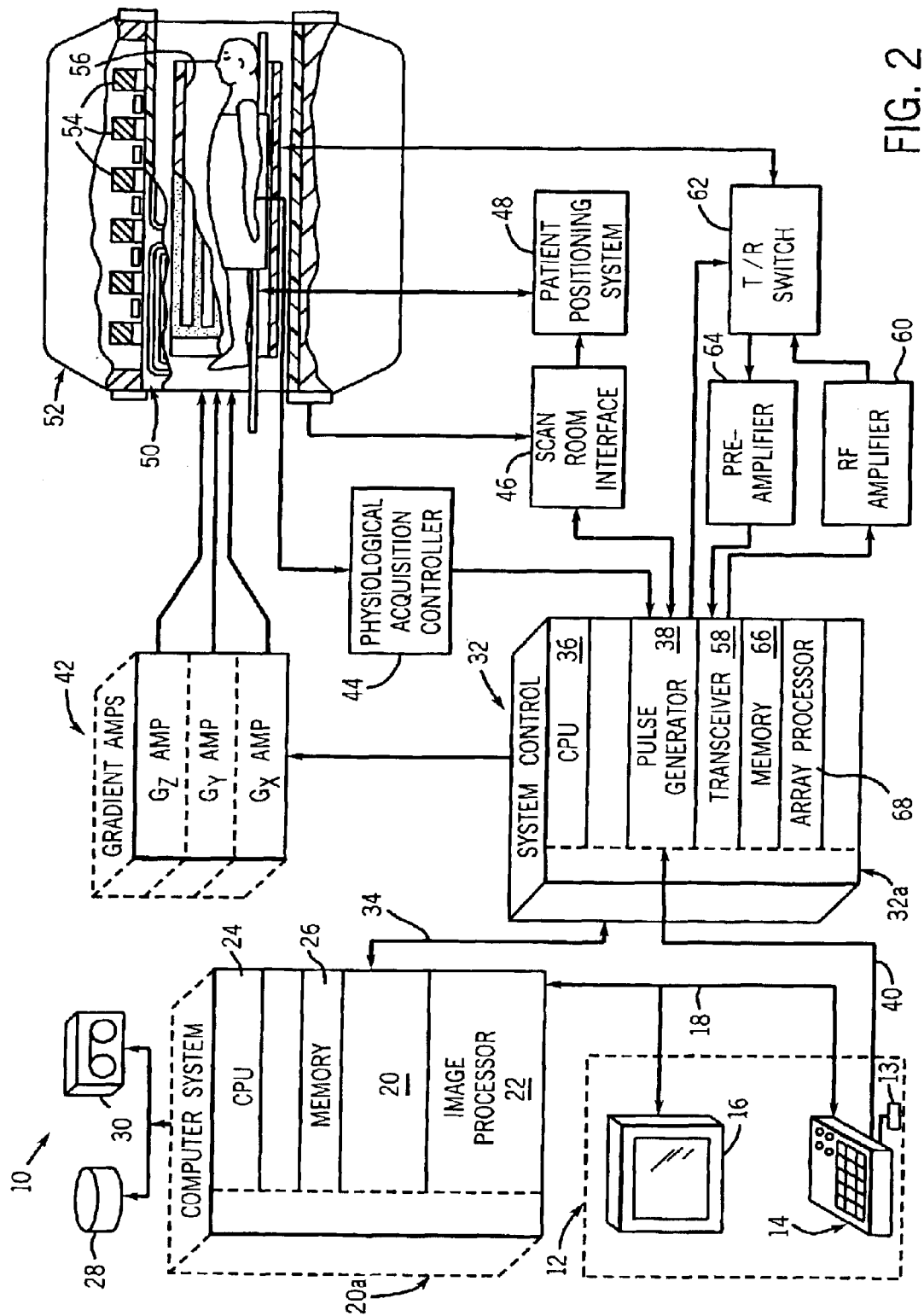
FIG. 2 is a schematic block diagram of an MR imaging system for use with the present invention.

Referring to FIG. 2, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 pan also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention will be described with respect to a method of controlling shimming of the B0 field generated by the magnet assembly of an MR imaging system. While the invention will be described as a series of steps carried out by a process or technique, the invention may be equivalently carried out by one or more computers or processors in accordance with executable instructions of a computer program. Additionally, the present invention will be described relative to shimming a permanent magnet, but the invention is equivalently applicable with other magnet types including, but not limited to superconducting magnets. Moreover, the hereinafter shimming processes may be carried out in a factory setting, at the installation site, or a combination of both.

Figure 3:
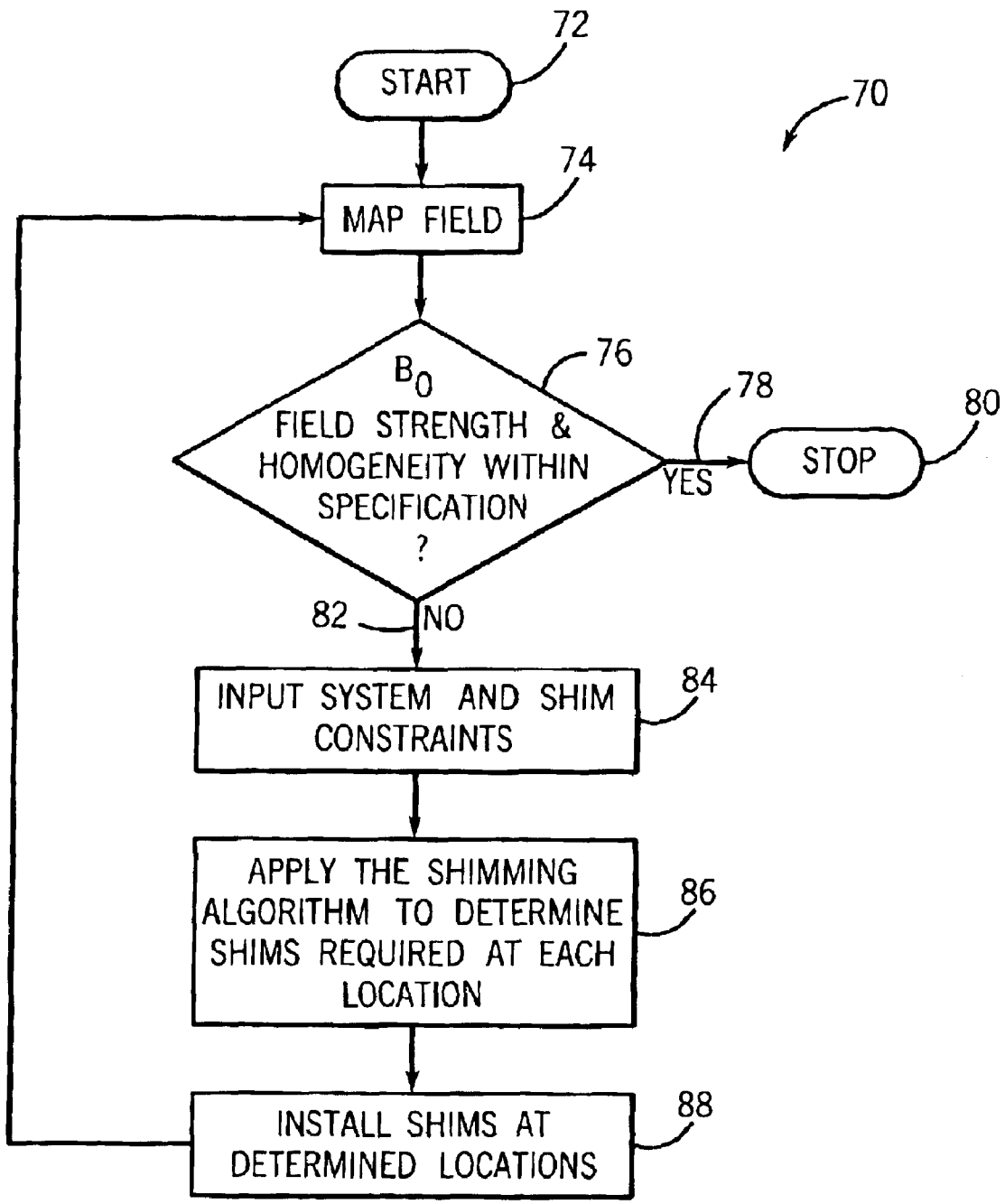
FIG. 3 is a flow chart setting forth the steps of a process of shimming a magnet assembly of an MR imaging system such that mechanical adjustments to an assembled magnet assembly are minimized.

Referring now to FIG. 3, the steps of a manufacturing process 70 for shimming an MR magnet assembly begins at 72 with the construction and assembly of a magnet assembly. Upon construction of the magnet assembly, a test B0 field is generated 74 and analyzed such that variations or inhomogeneities in the B0 field as well as field strength may be addressed and, if possible, corrected. As previously discussed, the magnetic field of an assembled magnet assembly is often inhomogeneous as a result of deviation in material properties and tolerances in the manufacturing process. Further, ferromagnetic objects placed in relative proximity to the magnet assembly may negatively affect field homogeneity and therefore must be taken in consideration.

From the field map generated at 74, the B0 field can be analyzed to determine if the field strength and homogeneity are within specified limits 76. If both are within limits 76, 78, the shimming process 70 is complete add ends at 80 with incorporation of the magnet assembly into an MR assembly and subsequent downstream processing. However, if either the field strength or field homogeneity is outside acceptable limits 76, 82, shimming process 70 continues with the input of system and shim constraints into one or more computers programmed to determine shimming parameters at 84.

The constraints input include the desired B0 field strength and the minimum acceptable field inhomogeneity. Other inputs include magnet system geometry constraints as well as shimming constraints. The shimming constraints include the physical limitations on each type of potential shim and placement of the shims within the magnet. For example, for active shims, constraints may include the maximum or minimum acceptable current that may be applied to the shim to control field contributions. In another example, mass constraints may be input for passive shims such as iron cores. As will be described in greater detail below, these constraints are utilized by a shimming algorithm to determine shim placement, type of shim, and amount of shim at 86.

Because both field strength and desired field homogeneity are input as shimming constraints, the determination of shim placement, type, and amount at 86 are such that implementation of shims according to the output of the algorithm does not result in substantial changes to the B0 field strength or achieves the desired B0 field strength while taking field homogeneity into account. As such, mechanical variations or changes to the magnet to increase or decrease field strength are unnecessary. Accordingly, shims are installed at 88 at each of the locations or target points identified at step 86 and the amount of "shimming material" applied at each shim location is likewise known from output of the algorithm or model at 86. As indicated above, the amount of "shimming material" is such that, as a whole, the desired field strength is attained and homogeneity is substantially achieved.

A verification of the B0 field is then undertaken with re-generation of the B0 field map at 74. An analysis is then made again at step 76 to determine if the field strength and inhomogeneity are within acceptable limits. If so, the shimming process is complete and ends at 80. If not, the shimming process continues with re-running of the shimming algorithm and adjustments to the shims applied. However, mechanical adjustments to the magnet assembly are avoided, as discussed above.

Figure 4:
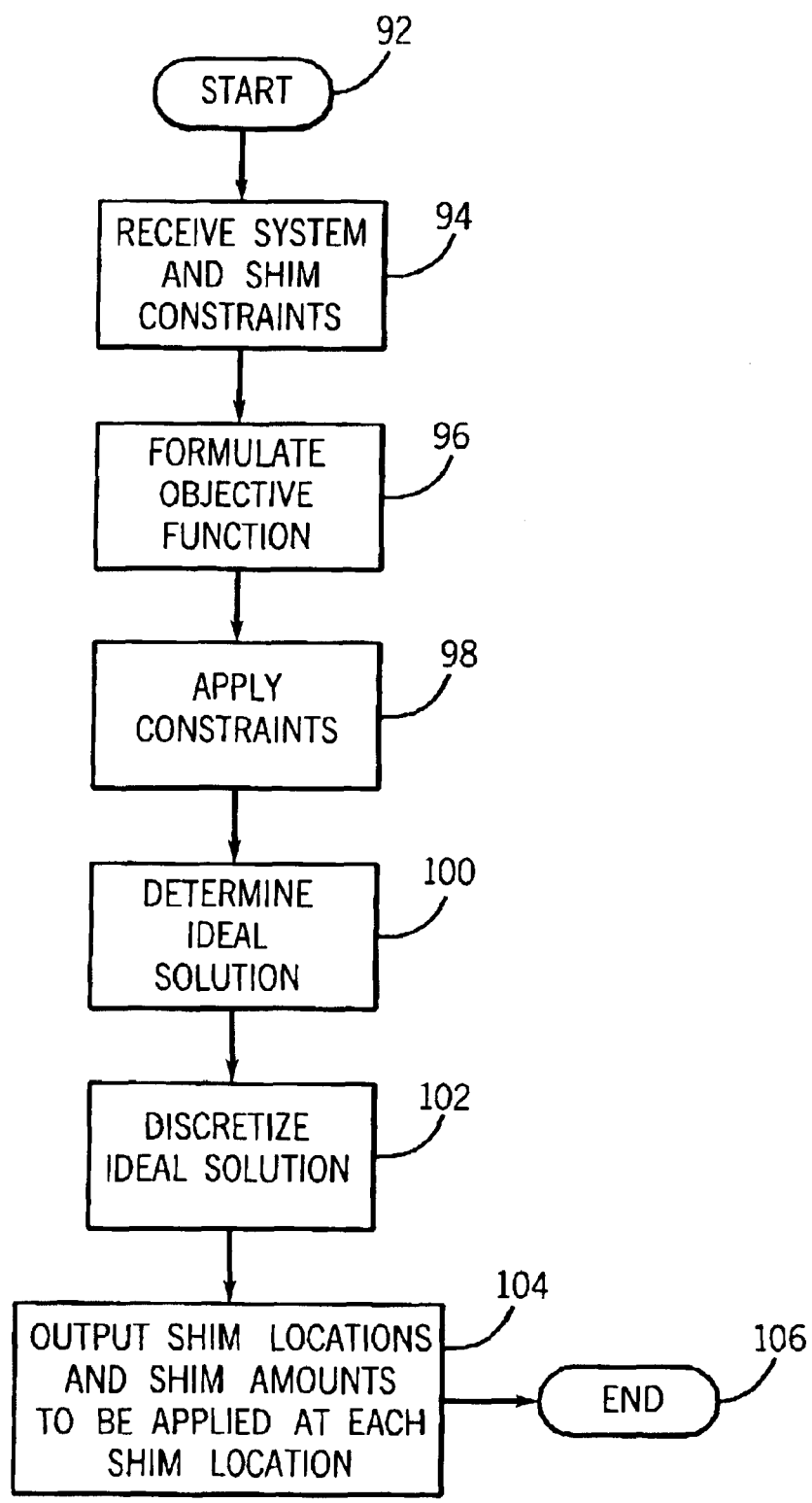
FIG. 4 is a flow chart setting for the high level acts carried out by one or more computers to determine minimal shimming of an MR magnet assembly in accordance with the present invention.

Referring now to FIG. 4, a high level illustration of acts of the shimming algorithm discussed above with respect to FIG. 3 is shown. The algorithm or technique 90, which is carried out by one or more computers, begins at 92 with the reception of system and shim constraints input at 94. From the system and shim constraints, an objective function is formulated at 96. The objective function, which may take one of many forms, is defined to determine a minimum amount of shimming required throughout the magnet assembly such that field inhomogeneities are removed and the desired field strength is achieved or, if applicable, maintained. Two examples of an objective function are described in greater detail below.

After formulating the appropriate objective function, the constraints input at 94 are applied at 98. From the constraints relative to the objective function, an ideal solution is determined at 100. The ideal solution sets forth the amount of shimming required at a number of locations or target points within the magnet assembly. However, it is necessary to take into consideration that the amount of shimming identified at each location may not be precisely possible. For example, iron shims are fabricated with varying degrees of mass. As such, there may not be an iron shim having the exact particular shim value identified as "ideal". Therefore, it is necessary to discretize the ideal solution at 102 to address variations between the "ideal" shim values and the shim values that are available. From the discretizing process, shim locations and shim amounts are output such that the shimming process described with respect to FIG. 3 may be carried out.

As noted above, the shimming algorithm may utilize one of a number of objective functions designed to address field inhomogeneities and field strength simultaneously. For example, a Linear Programming (LP) approach or implementation may be used or a least squares method. In one LP approach, the objective function may be defined as:

$$\text{Minimize Obj} = \Sigma V_i (I_i^+ - I_i^-) + \Sigma Wj^* Yj \quad \text{(Eqn. 1)}.$$

The function is limited or subjected to the following constraints:

$$-I_{max} \leq I_i^- \leq 0 \quad \text{(Eqn. 2)};$$

$$0 \leq I_i^{30} \leq I_{max} \quad \text{(Eqn. 3)};$$

$$Y_L \leq Yj \leq Y_U \quad \text{(Eqn. 4)};$$

and $$B_L \leq AX \leq B_U \quad \text{(Eqn. 5)};$$

where:

$I_i^-$, $I_i^+$ are state variables for active shims, such as resistive, superconducting or permanent magnet shims. For shimming coils, these are the amount of currents of appropriate sign required in the coil. For permanent magnet shims, these are the amounts of permanent magnet material of the appropriate polarity.

Yj is the state variables for passive shims. These are the amount of passive shims placed at each location.

$V_i$ is the weighting factors for the active shims;

$W_j$ is the weighting factors for the passive shims;

A is a shim strength matrix of the active and passive at each shim location, either in terms of field contributions to each shimming points or in terms of spherical harmonics including the B0 contribution;

X is a vector of all the state variables; and $B_L$ and $B_U$ are the constraint lower and upper bound vectors, in terms of field (Gauss, Tesla) or harmonics (ppm). These are the actual constraints that define the field homogeneity and the desired center field (B0).

It should be noted that Eqn. 5 may be characterized as $|AX - B_{target}| \leq \epsilon$ where $B_{target}$ is the target field or harmonics, and $\epsilon$ is the allowable tolerance vector.

In another LP approach, the following objective function may be defined and used to determine or compute a useful solution.

$$\text{Minimize Obj} = \Sigma a_i X_i + T + \beta Q \quad \text{(Eqn. 6)}.$$

The function is subjected to the following constraints:

$$\sum \Delta B_{ij} X_i + B_j^{input} - B_{mean} \leq \frac{T}{2} + \frac{E_j}{2}; \quad \text{(Eqn. 7)}$$

$$\sum \Delta B_{ij} X_i + B_j^{input} - B_{mean} \geq -\frac{T}{2} - \frac{E_j}{2}; \quad \text{(Eqn 8)}$$

$$B_{upper} - B_{mean} \leq \frac{Q}{2}; \text{ and} \quad \text{(Eqn 9)}$$

$$B_{mean} - B_{lower} \leq \frac{Q}{2}; \quad \text{(Eqn 10)}$$

$$0 \leq X_i \leq t_i \quad \text{(Eqn. 11)};$$

$$Q, T, B_{mean} \leq 0 \quad \text{(Eqn. 12)};$$

where:

$X_i$, are state variables for active shims, such as resistive, superconducting or permanent magnet shims. For shimming coils, these are the amount of currents of appropriate sign required in the coil. For permanent magnet shims, these are the amounts of permanent magnet material of the appropriate polarity.

$a_i$ is the weighting factors for the shims, and may be constant for all shims or may vary by type or even individual shims $\Delta B_{ij}$ is a shim strength matrix of the active and passive elements at each shim location, either in terms of field contributions to each shimming points or in terms of spherical harmonics.

$B_{Lower}$ and $B_{Upper}$ are the constraint lower and upper bound vectors, in terms of field. These are the actual constraints that define the field homogeneity and the desired center field (B0).

$B_{mean}$, Q, and T are solver variables that represent the average field, the amount above or below the B0 target window, and the amount above or below the PPM target, respectively.

$t_i$ represents the maximum value constraint for each shim, which can be, for example, a maximum current, mass or volume.

$\beta$ is the weighting factor between Uniformity and B0 target; and $B^{input}$ is the measured field value at each point.

The LP approach is preferred as it yields a fast and optimum solution. Further the LP approach allows the flexibility to set a window on the desired B0 level as well as a relative weighting for the importance of the B0 field level versus the homogeneity. Constraints on harmonics may be added in a similar for to or used in lieu of equations (7) and (8).

Another approach is implementation of a Least Squares solution. With this approach the solution is not necessarily optimal. As such, the desired field profile and center field strength may not be achieved. The specifics of this approach are as follows:

$$\text{Minimize Obj} = \Sigma V_i^* (B_{i\_Bi-target})^2 + \Sigma Wj^* Yj^2 \quad \text{(Eqn. 13)}.$$

Subject to the following constraint:

$$Y_L \leq Yj \leq Y_U \quad \text{(Eqn. 14)};$$

where:

$B_i$ is the predicted fields at the target points or the predicted harmonics and B0 ($0^{th}$ order harmonic is the B0);

$B_{i\_target}$ is the desired fields at the target points or the desired harmonics and B0 ($0^{th}$ order harmonic is the B0):

Yj is the state variables for the shims. These are the amount of passive or permanent magnet shim materials placed at each location, or the amount of current required for each shim coil.

$V_i$ is the weighting factors for the field or harmonic requirements; and $W_j$ is the weighting factors for the shim material.

Either approach recognizes desired field strength and desired homogeneity as a constraint on a shimming solution. Moreover, each approach determines a solution from the constraints on field strength and field inhomogeneity together with constraints on the type of shim and amount of shimming material available. As such, a solution can be generated that achieves the appropriate homogeneity and desired center field thereby avoiding mechanical adjustments to the magnet assembly. Additionally, with the above approaches, a deviation from the desired field strength or homogeneity is determined at a number of target points or locations. From this deviation or error, the amount of shimming material needed at each shim location can be minimized. Further, the shimming solutions may be developed based on the amount of field contribution of each shim at each of the determined locations or based on spherical harmonics including B0 contributions of each shim at each of the determined locations. These approaches are considered a "target field approach" and a "target harmonics approach", respectively.

Therefore, in accordance with one embodiment of the present invention, a method of shimming a magnet for an MR imaging system includes the steps of determining a desired B0 field strength for a B0 field having a number of target points and determining a minimum acceptable field inhomogeneity for the B0 field. The method also includes the step of determining at least one of a field strength variation from the desired B0 field strength and an inhomogeneity variation from the minimum acceptable field inhomogeneity at each target point. Each target point of the B0 field is then shimmed such that at least one of an actual B0 field strength at least approximates the desired B0 field strength and an actual field inhomogeneity does not exceed the minimum acceptable field inhomogeneity.

In accordance with another embodiment of the present invention, a computer readable storage medium having a computer program stored thereon to develop a shimming model for a magnet assembly of an MR imaging system, the computer program representing a set of instructions that when executed by a computer causes the computer to map a B0 field generated by an assembled magnet assembly. From the map, a number of target points within the B0 field are identified. The set of instructions then causes the computer to determine an amount of shimming required at each of the target points such that a desired field strength of the B0 field is maintained simultaneously with substantial cancellation of inhomogeneities within the B0 field.

According to another embodiment of the invention, a method of manufacturing a magnet assembly for an MR imaging system is provided. The method includes the step of constructing a permanent magnet assembly designed to generate a B0 field at a desired field strength about a volume-of-interest (VOI). Variations in field strength along the B0 field are then determined. Variations in the field strength are then minimized without requiring mechanical adjustments to the permanent magnet assembly.

The present invention has been described in terms of the preferred embodiment, and it is recognized that equivalents, alternatives, and modifications, aside from those expressly stated, are possible and within the scope of the appending claims.

What is claimed is:

1. A method of shimming a magnet for an MR imaging system, the method comprising the steps of:
   creating a B0 field about an imaging volume using a magnet assembly designed to generate a B0 field at a pre-defined field strength;
   determining a minimum acceptable field inhomogeneity for the B0 field;
   determining at least one of a field strength variation from the pre-defined B0 field strength and an inhomogeneity variation from the minimum acceptable field inhomogeneity at a number of target point along the B0 field; and
   shimming at at least a portion of the number of target points such that an actual field inhomogeneity does not exceed the minimum acceptable field inhomogeneity and the actual B0 field strength at least substantially approximates the pre-defined field strength after shimming.

2. The method of claim 1 wherein the step of shimming comprises the step of adding one of a passive shim element and/or an active shim element to a magnet assembly corresponding to at least a portion of the number of target points.

3. The method of claim 2 wherein the step of adding includes the steps of incorporating a shim coil into the magnet assembly at at least one of the number of target points and determining an amount of current to be applied to the shim coil to control contribution of magnetic field by the shim coil to the B0 field.

4. The method of claim 3 further comprising the step of constructing the shim coil such that harmonics of the magnetic field contributed by the shim coil offset inhomogeneities in the B0 field.

5. The method of claim 2 wherein the step of adding includes the step of incorporating one of a permanent magnet and an iron core into the magnet assembly at at least one of the number of target points, wherein the one of the permanent magnet and the iron core has a mass determined to be minimally sufficient to contribute to the B0 field strength and offset inhomogeneities in the B0 field.

6. The method of claim 2 further comprising the step of determining a shimming factor for each of the number of target points based on the at least one of a field strength variation from the pre-defined B0 field strength and an inhomogeneity variation from the minimum acceptable field inhomogeneity at each of the target points.

7. The method of claim 6 wherein the step of determining a shimming factor includes the step of determining a lower bound vector and an upper bound vector, the lower bound vector and the upper bound vector representing minimum and maximum constraints of at least one of the pre-defined B0 field strength and the minimum acceptable field inhomogeneity.

8. The method of claim 7 further comprising the steps determining at least one of field contribution at each of the number of target points and/or spherical harmonics at each of the number of target points and determining a convergence vector for each target point such that multiplication of the convergence vector to the at least one of field contribution and spherical harmonics at each of the number of target points yields a product that falls between the lower bound vector and the upper bound vector.

9. The method of claim 8 wherein the step of determining a convergence vector includes the step of determining a total amount of shimming required at each target point to achieve an actual B0 field strength that at least approximates the pre-defined B0 field strength and an actual field inhomogeneity that does not exceed the minimum acceptable field inhomogeneity.

10. A computer readable storage medium having a computer program stored thereon to develop a shimming model for a magnet assembly of an MR imaging system, the computer program representing a set of instructions that when executed by a computer causes the computer to:
   map a B0 field generated by an assembled magnet assembly designed to generate a B0 field at a pre-shimming field strength;
   identify a number of target points within the B0 field; and
   determine an amount of shimming required at each of the target points such that the pre-shimming field strength of the B0 field is maintained simultaneously with substantial cancellation of inhomogencities within the B0 field.

11. The computer readable storage medium of claim 10 wherein the set of instructions further causes the computer to generate a matrix comprised of amounts of shim strength necessary at each of the target points such that the pre-shimming field strength of the B0 field is maintained simultaneously with substantial cancellation of inhomogeneities within the B0 field.

12. The computer readable storage medium of claim 11 wherein the set of instructions further causes the computer to determine at least one of an active shim strength and a passive shim strength for each of the target points.

13. The computer readable storage medium of claim 12 wherein the amounts of shim strength are either in terms of field contribution at each of the target points or spherical harmonics including B0 contribution at each of the target points.

14. The computer readable storage medium of claim 12 wherein the set of instructions further causes the computer to determine an amount of shimming material required at each of the target points such that the pre-shimming field strength of the B0 field is maintained simultaneously with substantial cancellation of inhomogeneities within the B0 field.

15. The computer readable storage medium of claim 14 wherein the amount of shimming material depends upon shim type.

16. The computer readable storage medium of claim 15 wherein the set of instructions further causes the computer to determine amount of magnetic material if the shim type is a permanent magnet, determine amount of iron to incorporate into the magnet assembly if the shim type is a passive shim, and determine amount of current to apply if the shim type is an active shim coil.

17. A method of manufacturing a magnet assembly for an MR imaging system, the method comprising the steps of:

constructing a permanent magnet assembly designed to generate a B0 field at an average field strength and a desired field homogencity about a volume-of-interest (VOI);

determining variations in field homogeneity along the B0 field; and minimizing the variations in field homogeneity while maintaining the average field strength without mechanical adjustments to the permanent magnet assembly.

18. The method of claim 17 wherein the step of minimizing includes the step of incorporating a number shimming elements into the permanent magnet assembly.

19. The method of claim 18 further comprising the step of isolating a number of shimming points along the permanent magnet assembly and selectively adding at least one of an active shim element or a passive shim element at the number of shimming points.

20. The method of claim 19 further comprising the step of determining an amount of shimming material required at each of the shimming points such that cumulative variations in the field strength are offset by cumulative amounts of shimming material.

21. The method of claim 17 further comprising the step of determining an amount of field strength variation at each of the shimming points.

* * * * *